(12) United States Patent
Cheng

(10) Patent No.: US 11,228,088 B2
(45) Date of Patent: Jan. 18, 2022

(54) SEMICONDUCTOR DEVICE PACKAGE

(71) Applicant: Advanced Semiconductor Engineering, Inc., Kaohsiung (TW)

(72) Inventor: Hung-Hsiang Cheng, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 9 days.

(21) Appl. No.: 16/785,289

(22) Filed: Feb. 7, 2020

(65) Prior Publication Data

US 2021/0249756 A1  Aug. 12, 2021

(51) Int. Cl.
| | |
|---|---|
| *H01Q 1/22* | (2006.01) |
| *H01L 23/66* | (2006.01) |
| *H01Q 1/40* | (2006.01) |
| *H01L 23/498* | (2006.01) |

(52) U.S. Cl.
CPC ........... *H01Q 1/2283* (2013.01); *H01L 23/66* (2013.01); *H01Q 1/40* (2013.01); *H01L 23/49827* (2013.01); *H01L 2223/6677* (2013.01)

(58) Field of Classification Search
CPC ........ H01Q 1/2283; H01Q 1/40; H01L 23/66; H01L 23/49827; H01L 2223/6677
See application file for complete search history.

(56) References Cited

U.S. PATENT DOCUMENTS

| | | | |
|---|---|---|---|
| 7,863,154 B2* | 1/2011 | Yamazaki | H01L 24/83 438/455 |
| 8,786,060 B2* | 7/2014 | Yen | H01L 21/561 257/660 |
| 10,347,598 B2* | 7/2019 | Baek | H01L 23/49833 |
| 10,818,588 B2* | 10/2020 | Hsu | H01L 24/09 |
| 2019/0206774 A1 | 7/2019 | Rosch | |

* cited by examiner

*Primary Examiner* — Seung H Lee
(74) *Attorney, Agent, or Firm* — Foley & Lardner LLP

(57) ABSTRACT

The present disclosure relates to a semiconductor device package. The semiconductor device package includes an antenna layer having a feeding region and an insulating layer disposed on the antenna layer. The insulating layer has a first portion in contact with the antenna layer and a second portion on the first portion. The first portion and the second portion of the insulating layer define a stepped structure exposing the feeding region of the antenna layer. A method of manufacturing a semiconductor device package is also disclosed.

22 Claims, 7 Drawing Sheets

SEMICONDUCTOR DEVICE PACKAGE

BACKGROUND

1. Technical Field

The present disclosure generally relates to a semiconductor device package and a method of manufacturing the same, and to a semiconductor device package including an antenna and an insulating layer.

2. Description of the Related Art

The development of mobile communication has created a demand for high-speed data rates and stable communication quality, and high frequency wireless transmission (e.g., 28 GHz, 39 GHz or 60 GHz) has become one of the most important issues in the mobile communication industry. In order to achieve such high frequency wireless transmission, the signals must be transmitted in a band having wavelengths from about ten to about one millimeter ("millimeter wave," or "mmWave"). However, signal attenuation is one of the main problems in millimeter wave transmission.

SUMMARY

In one or more embodiments, a semiconductor device package includes an antenna layer having a feeding region and an insulating layer disposed on the antenna layer. The insulating layer has a first portion in contact with the antenna layer and a second portion on the first portion. The first portion and the second portion of the insulating layer define a stepped structure exposing the feeding region of the antenna layer.

In one or more embodiments, a semiconductor device package includes a first antenna layer having a feeding region and an insulating layer disposed on the first antenna layer. The insulating layer defines a first opening to expose the feeding region of the first antenna layer and a second opening over the first opening. A ratio of the width of the second opening to the width of the first opening is from about 1.2 to about 2.4.

In one or more embodiments, a method for manufacturing a semiconductor device package includes providing an antenna layer having a feeding region and disposing an insulating layer on the antenna layer. The method also includes removing a portion of the insulating layer to form a first opening exposing the feeding region and a second opening over the first opening.

BRIEF DESCRIPTION OF THE DRAWINGS

Aspects of the present disclosure are readily understood from the following detailed description when read with the accompanying figures. It should be noted that various features may not be drawn to scale. The dimensions of the various features may be arbitrarily increased or reduced for clarity of discussion.

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1:
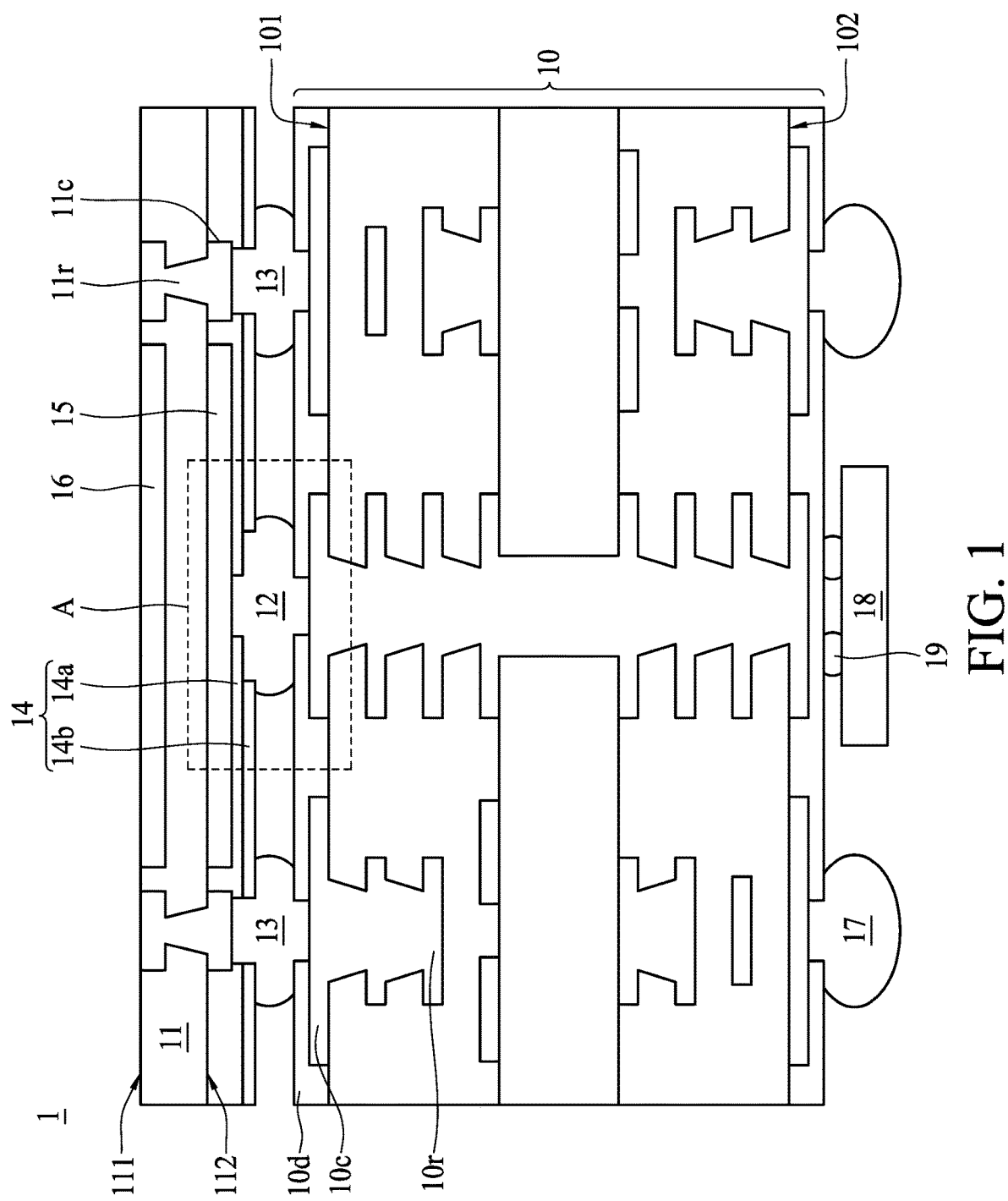
FIG. 1 illustrates a cross-sectional view of a semiconductor device package in accordance with some embodiments of the present disclosure.

The following disclosure provides for many different embodiments, or examples, for implementing different features of the provided subject matter. Specific examples of components and arrangements are described below. These are, of course, merely examples and are not intended to be limiting. In the present disclosure, reference to the formation of a first feature over or on a second feature in the description that follows may include embodiments in which the first and second features are formed in direct contact, and may also include embodiments in which additional features may be formed between the first and second features, such that the first and second features may not be in direct contact. Besides, the present disclosure may repeat reference numerals and/or letters in the various examples. This repetition is for simplicity and clarity and does not in itself dictate a relationship between the various embodiments and/or configurations discussed.

Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

FIG. 1 illustrates a cross-sectional view of a semiconductor device package 1 in accordance with some embodiments of the present disclosure. The semiconductor device package 1 includes substrates 10, and 11, electrical contacts 12, 13, 17, and 19, an insulating layer 14, antenna layers 15, and 16, and an electronic component 18.

The substrate 10 may be, for example, a printed circuit board, such as a paper-based copper foil laminate, a composite copper foil laminate, or a polymer-impregnated glass-fiber-based copper foil laminate. The substrate 10 has a surface 101 and a surface 102 opposite the surface 101. In some embodiments, the substrate 10 may be a single-layer substrate or multi-layer substrate which includes a core layer and a conductive material and/or structure disposed the surfaces 101 and 102. The conductive material and/or structure may include a plurality of traces. For example, the substrate 10 includes an interconnection structure 10r, such as a redistribution layer (RDL) or a grounding element. The substrate 10 includes one or more conductive pads 10c in proximity to, adjacent to, or embedded in and exposed at the surface 101 of the substrate 10. The substrate 10 includes a dielectric layer 10d on the surface 101 of the substrate 10 to fully expose or to expose at least a portion of the conductive pads 10c for electrical connections. For example, the dielectric layer 10d may cover a portion of the conductive pads 10c. In some embodiments, the dielectric layer 10d may include a solder resist or solder mask.

The substrate 11 is disposed over the substrate 10 and spaced apart from the substrate 10. In some embodiments, the substrate 11 can be the same as or different from the substrate 10 depending on design specifications. The substrate 11 has a surface 111 and a surface 112 opposite to the surface 111. The surface 112 of the substrate 11 faces the surface 101 of the substrate 10. In some embodiments, the surface 101 of the substrate 10 is parallel to the surface 112 of the substrate 11. The substrate 11 includes an interconnection structure 11r, such as a RDL or a grounding element. The substrate 11 includes one or more conductive pads 11c in proximity to, adjacent to, or embedded in and exposed at the surface 112 of the substrate 11.

The antenna layer 15 is disposed on the surface 112 of the substrate 11. The antenna layer 16 is disposed on (or is exposed from) the surface 111 of the substrate 11 corresponding to (e.g. disposed above) the antenna layer 15 disposed on the surface 112 of the substrate 11. For example, the antenna layer 16 faces the antenna layer 15. For example, the antenna layer 16 may be aligned with the antenna layer 15. In some embodiments, the antenna layer 15 includes a plurality of antenna elements. For example, the antenna layer 15 may include an array of antenna elements. In some embodiments, the antenna layer 15 may include an M×N array of antenna elements, where M and N are integers greater than 0. In some embodiments, the antenna layer 16 may also include a plurality of antenna elements.

In some embodiments, the antenna layers 15 and 16 may include a conductive material such as a metal or metal alloy. Examples of the conductive material include gold (Au), silver (Ag), aluminum (Al), copper (Cu), or an alloy thereof.

In some embodiments, the semiconductor device package 1 is designed for high frequency wireless transmission (e.g., 28 GHz, 39 GHz or 60 GHz). A width of the antenna layers 15 and 16 may be smaller than about 3.0 millimeters (mm). For example, the width of the antenna layers 15 and 16 may be about 2.8 mm, 2.6 mm, 2.4 mm, 2.2 mm, 2.0 mm, 1.8 mm, 1.6 mm, 1.4 mm, 1.2 mm, 1.0 mm, 0.8 mm or less. In some embodiments, the width of the antenna layers can be measured in a direction parallel to the surface 111 of the substrate 11. In some embodiments, the number of the antenna layers can be changed depending on design requirements.

The insulating layer 14 is disposed on the surface 112 of the substrate 11 to cover at least a portion of the antenna layer 15. For example, a feeding region of the antenna layer 15 is exposed from the insulating layer 14. The feeding region of the antenna layer 15 is exposed for electrically connecting to the substrate 10 (and the interconnection structure 10r therein) through the electrical contact 12, while the other region of the antenna layer 15 is covered or protected by the insulating layer 14. In some embodiments, the insulating layer 14 may also be referred to as a protecting layer, a dielectric layer, or a position-defining layer.

The insulating layer 14 includes a portion (or a sublayer) 14a in contact with the antenna layer 15 and a portion (or a sublayer) 14b on the portion 14a.

As shown in FIG. 1, the portion 14a defined an opening partially exposing the antenna layer 15, and the portion 14b defined another opening adjacent to the opening defined by the portion 14a. The opening defined by the portion 14b has a width different from a width of the opening defined by the portion 14a. The portion 14a is partially exposed from the opening defined by the portion 14b. The opening defined by the portion 14a is smaller than the opening defined by the portion 14b. The portion 14a and the opening 14b define a stepped structure.

The feeding region of the antenna layer 15 is exposed through the opening defined by the portion 14a and the opening defined by the portion 14b.

The conductive pads 11c is adjacent to and spaced apart from the antenna layer 15.

Similar to the feeding region of the antenna layer 15, the conductive pads 11c is fully or partially exposed from the insulating layer 14. The insulating layer 14 is disposed on the surface 112 of the substrate 11 to fully expose or to expose at least a portion of the conductive pads 11c for electrical connections.

As shown in FIG. 1, the portion 14a and the portion 14b defined an opening partially exposing the conductive pads 11c. In other words, a width of the opening defined by the portion 14a is substantially similar to a width of the opening defined by the portion 14b. The opening defined by the portion 14a and the portion 14b can be formed in the same operation. In some embodiments, a width of the opening exposing the conductive pads 11c may be greater than the width w1 as denoted in FIG. 2, which would be discussed later. In some embodiments, a width of the opening exposing the conductive pads 11c may be substantially equal to the width w2 as denoted in FIG. 2, which would be discussed later.

In some embodiments, the opening exposing the conductive pads 11c may have a structure similar to the opening exposing the feeding region of the antenna layer 15. For example, the opening defined by the portion 14a is smaller than the opening defined by the portion 14b. In such embodiments, the portion 14a and the portion 14b define a stepped structure exposing the conductive pads 11c.

In some embodiments, the insulating layer 14 may include a dielectric material. In some embodiments, the insulating layer 14 may include a solder resist or solder mask.

The electrical contacts 12 and 13 are disposed between the substrate 10 and the substrate 11. The electrical contacts 12 and 13 are disposed between the surface 101 of the substrate 10 and the substrate 112 of the substrate 11. The electrical contact 12 is disposed on the conductive pad 10c of the substrate 10 and the antenna layer 15. The electrical contact 12 covers the stepped structure exposing the antenna layer 15. The electrical contact 12 is in direct contact with the portion 14a and the portion 14b. The electrical contact 12 is in direct contact with the feeding region of the antenna layer 15.

The electrical contact 13 is disposed on the conductive pad 10c of the substrate 10 and the conductive pad 11c of the substrate 11. The electrical contact 13 covers the stepped structure exposing the conductive pad 11c. The electrical contact 13 is in direct contact with the portion 14a and the portion 14b. The electrical contact 13 is in direct contact with the conductive pad 11c.

The electrical contacts 12 and 13 are disposed between the substrates 10 and 11 to define a height, a distance, a cavity (e.g. an air cavity) or cavities therebetween; such cavities are designed to be about 100 micrometers (μm) to about 400 μm in order to achieve frequency agility and improve bandwidth.

In some embodiments, each of the electrical contacts 12 and 13 may include a solder ball, a conductive pillar (such as a Cu pillar), or a combination thereof. For example, each of the electrical contacts 12 and 13 may include a Cu pillar (which can be used to control the height of the air gap between the substrates 10 and 11) and a solder ball connecting the Cu pillar to the feeding region or the conductive pad 11c. In some embodiments, each of the electrical contacts 12 and 13 may include soldering materials. In some embodiments, the number of electrical contacts can be changed depending on design requirements.

The electronic component 18 is disposed on the surface 102 of the substrate 10. In some embodiments, the electronic component 18 electrically connected to the antenna layer 15 through the interconnection structure 10r within the substrate 10. The electronic component 18 may be a chip or a die including a semiconductor substrate, one or more integrated circuit devices and one or more overlying interconnection structures therein. The integrated circuit devices may include active devices such as transistors and/or passive devices such as resistors, capacitors, inductors, or a combination thereof. The electronic component 18 may be electrically connected to the substrate 10 (e.g., to the conductive pads), and electrical connection may be attained by way of flip-chip (such as through the electrical contacts 19) or wire-bond techniques.

Electrical contact 17 (e.g. a solder ball) is disposed on the conductive pads 10c and can provide electrical connections between the semiconductor package device 1 and external components (e.g. external circuits or circuit boards).

Figure 2:
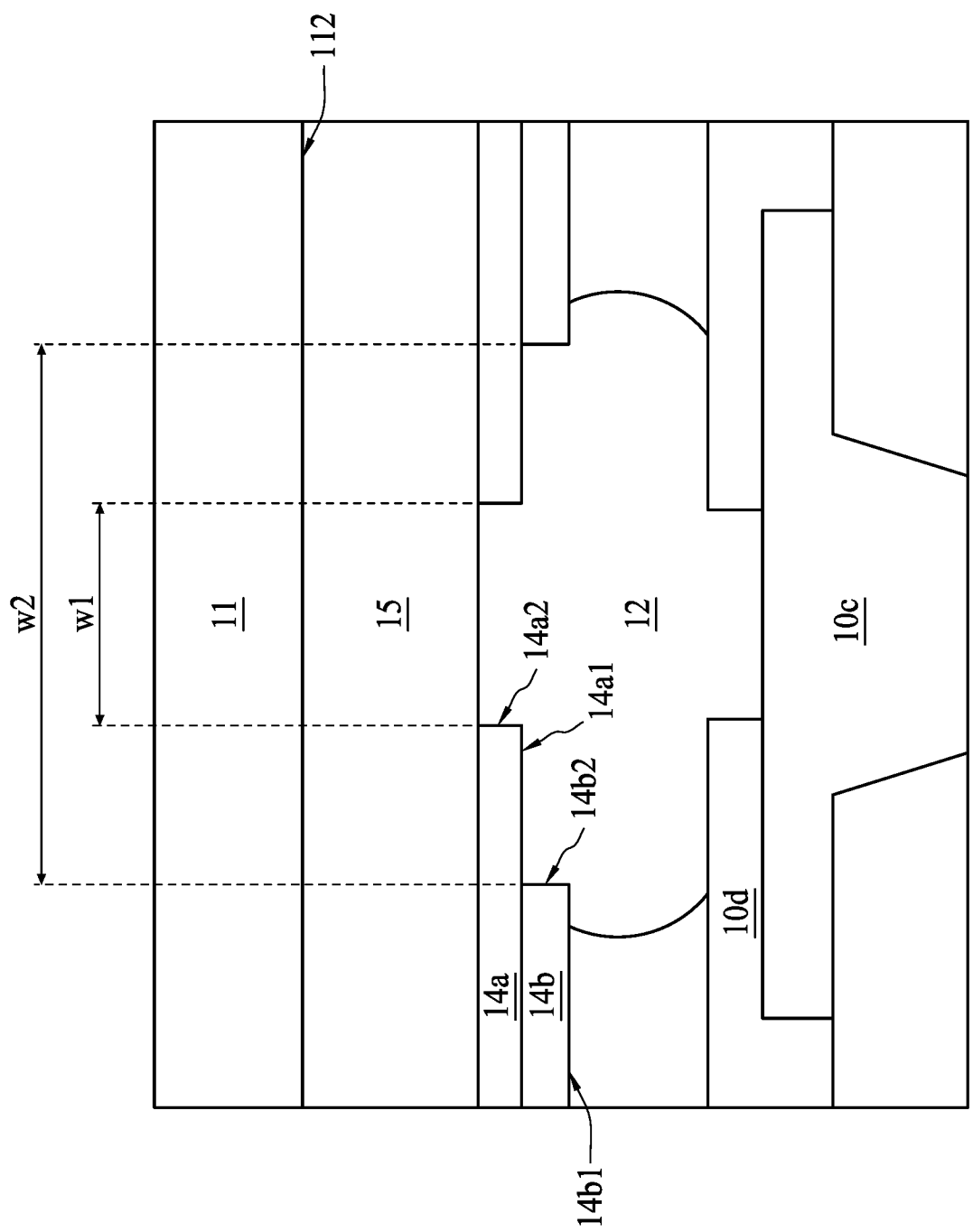
FIG. 2 illustrates an enlarged view of a portion in a dotted box A as shown in FIG. 1 in accordance with some embodiments of the present disclosure.

FIG. 2 illustrates an enlarged view of a portion in a dotted box A as shown in FIG. 1 in accordance with some embodiments of the present disclosure.

The portion 14a of the insulating layer 14 includes a surface 14a1 and a surface 14a2 substantially perpendicular to the surface 14a1. The surface 14a1 may also be referred to as a top surface of the portion 14a and the surface 14a2 may also be referred to as a lateral surface of the portion 14a. The portion 14b of the insulating layer 14 includes a surface 14b1 and a surface 14b2 substantially perpendicular to the surface 14b1. The surface 14b1 may also be referred to as a top surface of the portion 14b and the surface 14b2 may also be referred to as a lateral surface of the portion 14b.

The surface 14a2 of the portion 14a is connected to the surface 14b2 of the portion 14b through the surface 14a1 of the portion 14a. The surface 14a1 and the surface 14a2 of the portion 14a and the surface 14b2 of the portion 14b define the stepped structure.

The surface 14a2 of portion 14a defined an opening having a width w1. The surface 14b2 of portion 14b defined an opening having a width w2.

In some embodiments, a difference between the width w2 and the width w1 is equal to or greater than about 30 μm, such as from about 30 μm to about 140 μm. In some embodiments, a ratio of the width w2 to the width w1 is from about 1.2 to about 2.4.

The dimension design rule of the width w2 and the width w1 provided in the description is only for illustrative purposes, and the present application is not limited thereto. In some embodiments, the dimension design rule of the width w2 and the width w1 may be adjusted depending on design specifications.

As mentioned, the air gap between the substrates 10 and 11 is designed to be large in order to achieve frequency agility and improve bandwidth. For example, the air gap between the substrates 10 and 11 may be designed to be about 100 μm to about 400 μm, such as 300 μm.

Therefore, in some embodiments, the dimension of the electrical contacts 12 and 13 (e.g. a height) may be about 250 μm to about 350 μm, and the width w2 may be at least about 250 μm in order to maintain structural stability of the electrical contacts 12 and 13. For example, the height of the electrical contact 12 may be about 300 μm, and the width w2 may be about 300 μm.

In some comparative implementations, the stepped structure can be omitted and the feeding region of the antenna layer 15 is exposed from only one opening having a slanted or perpendicular sidewall. In such comparative implementations, the size of the feeding region is substantially equal to the width w2. However, the feeding region may exceed the requirements of impedance matching for a high frequency wireless transmission. For example, the feeding region for 60 GHz wireless transmission is preferably less than 80 μm.

As high frequency wireless transmission has become one of the most important issues in the mobile communication industry, it is desirable to miniaturize the feeding region in order to meet the requirements of impedance matching.

The dimension design rules of the stepped structure (e.g. the widths w1 and w2) of the present application not only meet the requirements of impedance matching for high frequency wireless transmission, but also maintain the air gap height.

For example, the difference between the width w2 and the width w1 can help maintain the structural stability of the electrical contact 12 without compromising the performance of the impedance matching. For example, the ratio of the width w2 to the width w1 can help maintain the structural stability of the electrical contact 12 without compromising the performance of the impedance matching.

FIG. 3A, FIG. 3B, FIG. 3C, 3D, and FIG. 3E, are cross-sectional views of a semiconductor device package at various stages of fabrication, in accordance with some embodiments of the present disclosure. At least some of these figures have been simplified for a better understanding of the aspects of the present disclosure.

Figure 3A:
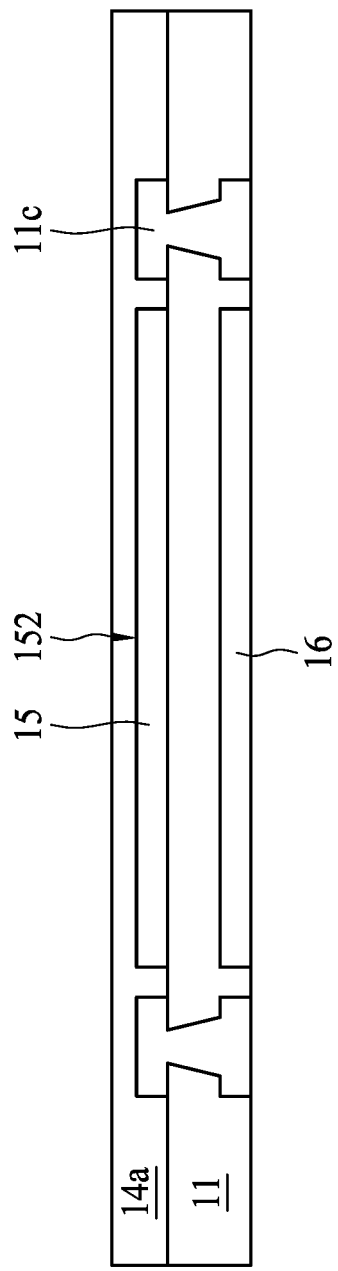
FIG. 3A illustrates one or more stages of a method of manufacturing a semiconductor device package in accordance with some embodiments of the present disclosure.

Referring to FIG. 3A, a strip of substrates including the substrate 11 is provided. The substrate 11 has conductive pads 11c and antenna layers 15 and 16 are provided in the substrate 11. The antenna layer 15 has a surface 152 facing away from the substrate 11. A dielectric material is disposed on the substrate 11 as a layer (or a sublayer) 14a to cover the surface 152 of the antenna layer 15. In some embodiments, the dielectric material may be formed by, for example, coating, lamination or other suitable processes.

Figure 3B:
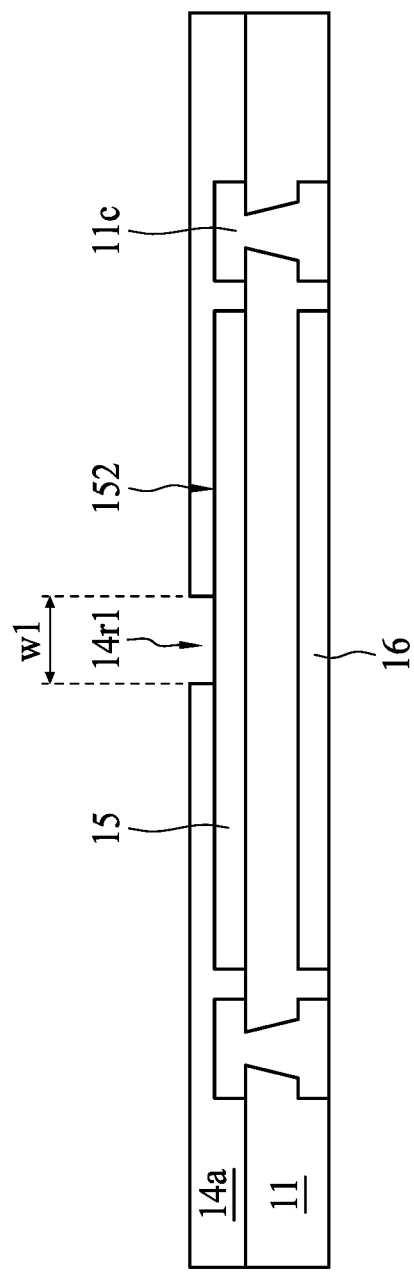
FIG. 3B illustrates one or more stages of a method of manufacturing a semiconductor device package in accordance with some embodiments of the present disclosure.

Referring to FIG. 3B, the layer 14a may be partially removed (or be patterned) through a photoresist film (or a mask) to form an opening 14r1 and a portion of the surface 152 of the antenna layer 15 may expose through the opening 14r1. The exposed portion of the antenna layer 15 may be a feeding region of the antenna layer 15. The opening 14r1 has a width w1.

Figure 3C:
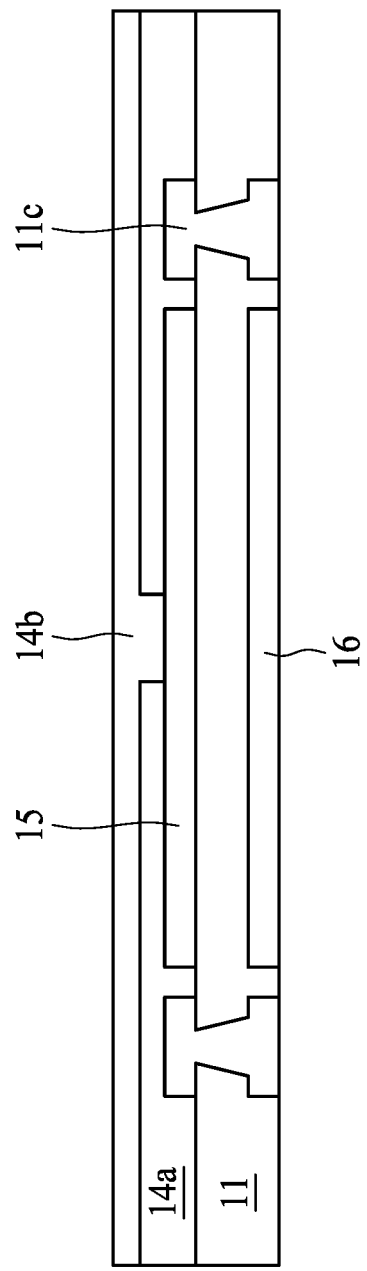
FIG. 3C illustrates one or more stages of a method of manufacturing a semiconductor device package in accordance with some embodiments of the present disclosure.

Referring to FIG. 3C, a dielectric material is disposed on the substrate 11 as a layer (or a sublayer) 14b to cover the exposed portion of the surface 152 of the antenna layer 15. The layer 14b also covers the layer 14a. In some embodiments, the dielectric material may be formed by, for example, coating, lamination or other suitable processes.

Figure 3D:
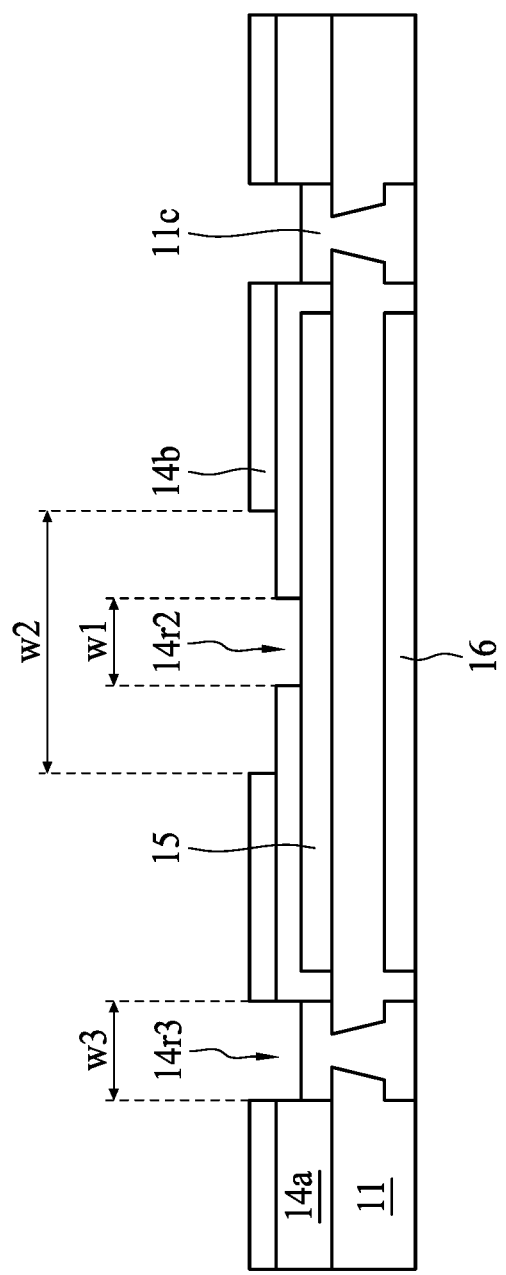
FIG. 3D illustrates one or more stages of a method of manufacturing a semiconductor device package in accordance with some embodiments of the present disclosure.

Referring to FIG. 3D, the layer 14b is partially removed or patterned through a photoresist film (or a mask) to form an opening 14r2 and a portion of the layer 14a is exposed through the opening 14r2. The opening 14r2 has a width w2. The width w2 is greater than the width w1. After the layer 14b is patterned, the layer 14a and the layer 14b define a stepped structure.

The layer 14a and layer 14b are partially removed or patterned through a photoresist film (or a mask) to form an opening 14r3 and a portion of the conductive pad 11c is exposed through the opening 14r3. The opening 14r3 has a width w3. In some embodiments, the width w3 may be greater than the width w1. In some embodiments, the width w3 may be substantially equal to the width w2.

In some embodiments, the layer 14a and layer 14b may be partially removed in the same operation to define the opening 14r3.

Figure 3E:
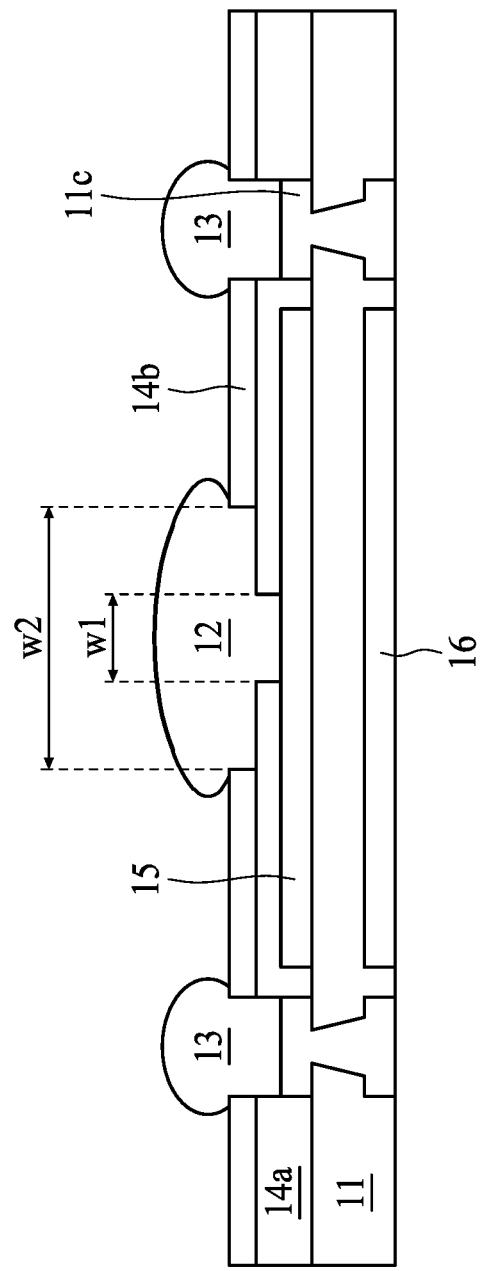
FIG. 3E illustrates one or more stages of a method of manufacturing a semiconductor device package in accordance with some embodiments of the present disclosure.

Referring to FIG. 3E, an electrical contact 12 is disposed on the substrate 11 to contact the exposed portion (or the feeding region) of the antenna layer 15. An electrical contact 13 is disposed on the substrate 11 to contact the exposed portion of the conductive pad 11c.

Then the structure in FIG. 3E may be turned over and connected to the substrate 10 and the electronic component 18 as shown in FIG. 1, and the electrical connection may be obtained through the electrical contacts 12 and 13. A singulation may be performed to separate out individual semiconductor package devices as shown in FIG. 1. That is, the singulation is performed through the substrate strip including the substrate 11. The singulation may be performed, for example, by using a dicing saw, laser or other appropriate cutting technique. The final structure may be similar to the semiconductor device package 1 in FIG. 1.

Spatially relative terms, such as "beneath," "below," "lower," "above," "upper," "left," "right" and the like, may be used herein for ease of description to describe one element or feature's relationship to another element(s) or feature(s) as illustrated in the figures. The spatially relative terms are intended to encompass different orientations of the device in use or operation, in addition to the orientation depicted in the figures. The apparatus may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

As used herein, the terms "approximately", "substantially", "substantial" and "about" are used to describe and account for small variations. When used in conduction with an event or circumstance, the terms can refer to instances in which the event or circumstance occurs precisely as well as instances in which the event or circumstance occurs to a close approximation. As used herein with respect to a given value or range, the term "about" generally means within ±10%, ±5%, ±1%, or ±0.5% of the given value or range. Ranges can be expressed herein as from one endpoint to another endpoint or between two endpoints. All ranges disclosed herein are inclusive of the endpoints unless specified otherwise. The term "substantially coplanar" can refer to two surfaces within micrometers (μm) of lying along the same plane, such as within 10 μm, within 5 μm, within 1 μm, or within 0.5 μm of lying along the same plane. When referring to numerical values or characteristics as "substantially" the same, the term can refer to the values lying within ±10%, ±5%, ±1%, or ±0.5% of an average of the values.

The foregoing outlines features of several embodiments and detailed aspects of the present disclosure. The embodiments described in the present disclosure may be readily used as a basis for designing or modifying other processes and structures for carrying out the same or similar purposes and/or achieving the same or similar advantages of the embodiments introduced herein. Such equivalent constructions do not depart from the spirit and scope of the present disclosure, and various changes, substitutions, and alterations may be made without departing from the spirit and scope of the present disclosure.

What is claimed is:

1. A semiconductor device package, comprising:
a first antenna layer; and
an insulating layer disposed on the first antenna layer, the insulating layer having a first portion exposing a part of the first antenna layer and a second portion on the first portion;
wherein the second portion of the insulating layer exposes the part of the first antenna layer and a part of the first portion of the insulating layer, and wherein a projection region of the part of the first portion of the insulating layer on the first antenna layer and a projection region of the second portion of the insulating layer on the first antenna layer are non-overlapping.

2. The semiconductor device package of claim 1, wherein the insulating layer comprises an opening exposing a lateral surface of the first portion and a lateral surface of the second portion, and wherein the lateral surface of the first portion and the lateral surface of the second portion are substantially coplanar.

3. The semiconductor device package of claim 1, further comprising:
a substrate spaced apart from the insulating layer; and
an electronic component disposed on the substrate, wherein the electronic component is configured to electrically connect to the first antenna layer through the substrate.

4. The semiconductor device package of claim 3, wherein the substrate is disposed between the electronic component and the first antenna layer.

5. The semiconductor device package of claim 1, wherein the first portion of the insulating layer has a first opening, the second portion of the insulating layer has a second opening over the first opening, and a width of the first opening is less than a width of the second opening.

6. The semiconductor device package of claim 5, further comprising:
an interconnection structure disposed on the insulating layer and spaced apart from the first antenna layer, wherein a portion of the interconnection structure is exposed from a third opening of the insulating layer.

7. The semiconductor device package of claim 6, further comprising:
a substrate physically separated from the insulating layer;
a first electrical contact connecting the substrate to the first antenna layer through the first opening and the second opening of the insulating layer; and
a second electrical contact connecting the substrate to the interconnection structure through the third opening of the insulating layer.

8. The semiconductor device package of claim 5, further comprises:
a second antenna layer disposed over the first antenna layer and configured to electrically couple to the first antenna layer.

9. The semiconductor device package of claim 8, further comprises:
a substrate; and
an electrical contact connecting the substrate to the first antenna layer through the first opening and the second opening of the insulating layer, and wherein a part of the electrical contact is exposed to air.

10. A semiconductor device package, comprising:
a first antenna layer;
an insulating layer disposed on the first antenna layer, wherein the insulating layer has a top surface, a bottom surface opposite to the top surface, a first lateral surface recessed from the top surface toward the bottom surface and a second lateral surface recessed from the bottom surface toward the top surface, wherein the first lateral surface and the second lateral surface define a ladder structure, and wherein the first lateral surface and the second lateral surface are non-overlapping in a direction perpendicular to the top surface.

11. The semiconductor device package of claim 10, wherein the top surface of the insulating layer is closer to the first antenna layer than the bottom surface of the insulating layer to the first antenna layer.

12. The semiconductor device package of claim 11, wherein the first lateral surface and the second lateral surface of the insulating layer have a step profile.

13. The semiconductor device package of claim 10, further comprises:
   an electronic component configured to electrically connect to the first antenna layer through the substrate.

14. The semiconductor device package of claim 10, further comprises:
   a second antenna layer disposed over the first antenna layer and configured to electrically couple to the first antenna layer.

15. The semiconductor device package of claim 14, further comprises:
   a grounding element adjacent to the first antenna layer and the second antenna layer.

16. The semiconductor device package of claim 15, further comprises:
   a dielectric layer disposed on the top surface of the insulating layer, and wherein the second antenna layer is disposed within the dielectric layer.

17. The semiconductor device package of claim 10, further comprising:
   a substrate disposed over the first antenna layer; and
   an electrical contact connecting the substrate to the first antenna layer through a through hole of the insulating layer.

18. The semiconductor device package of claim 17, wherein the electrical contact is in contact with the bottom surface of the insulating layer.

19. The semiconductor device package of claim 17, wherein the insulating layer further includes a surface connecting the first lateral surface with the second lateral surface, and the electrical contact is in contact with the surface of the insulating layer.

20. A semiconductor device package, comprising:
   a first antenna layer having a feeding region;
   an insulating layer disposed on the first antenna layer, the insulating layer defining a first opening to expose the feeding region of the first antenna layer and a second opening over the first opening;
   a dielectric layer having a first surface and a second surface opposite the first surface; and
   a second antenna layer disposed on the first surface;
   wherein the first antenna layer is disposed on the second surface.

21. The semiconductor device package of claim 20, further comprising:
   a substrate disposed on the first antenna layer; and
   a soldering layer connecting the substrate to the feeding region of the first antenna layer through the second opening and the first opening.

22. The semiconductor device package of claim 20, wherein a ratio of a width of the second opening to a width of the first opening is from about 1.2 to about 2.4.

* * * * *